United States Patent [19]

Kertis et al.

[11] Patent Number: 4,855,624
[45] Date of Patent: Aug. 8, 1989

[54] LOW-POWER BIPOLAR-CMOS INTERFACE CIRCUIT

[75] Inventors: Robert A. Kertis; Douglas D. Smith, both of Puyallup; Terrance L. Bowman, Sumner, all of Wash.

[73] Assignee: National Semiconductor Corporation, Santa Clara, Calif.

[21] Appl. No.: 151,347

[22] Filed: Feb. 2, 1988

[51] Int. Cl.$^4$ .............................................. H03K 17/16
[52] U.S. Cl. .................................... 307/475; 307/443; 307/446
[58] Field of Search ............... 307/443, 446, 451, 475, 307/362–363, 272 R, 296 R, 297

[56] References Cited

U.S. PATENT DOCUMENTS

| | | | |
|---|---|---|---|
| 4,430,582 | 2/1984 | Bose et al. | 307/475 X |
| 4,453,095 | 6/1984 | Wrathall | 307/475 |
| 4,555,642 | 11/1985 | Morales | 307/475 |
| 4,563,601 | 1/1986 | Asano et al. | 307/443 X |
| 4,642,488 | 2/1987 | Parker | 307/475 |
| 4,645,951 | 2/1987 | Uragami | 307/475 X |
| 4,645,954 | 2/1987 | Schuster | 307/475 |

Primary Examiner—David Hudspeth
Attorney, Agent, or Firm—Lee Patch; Robert C. Colwell; Paul S. Drake

[57] ABSTRACT

A biCMOS interface circuit receives a plurality of incoming signals at a first level and supplies a plurality of output signals at a second level. The interface circuit establishes control voltages which are used to maintain an identical trip point in each of a plurality of translator circuits. Generally, the trip point is set at midway between the "high" and the "low" levels of the incoming logic signal. The control voltages assure reliable performance over a wide operating environment.

11 Claims, 3 Drawing Sheets

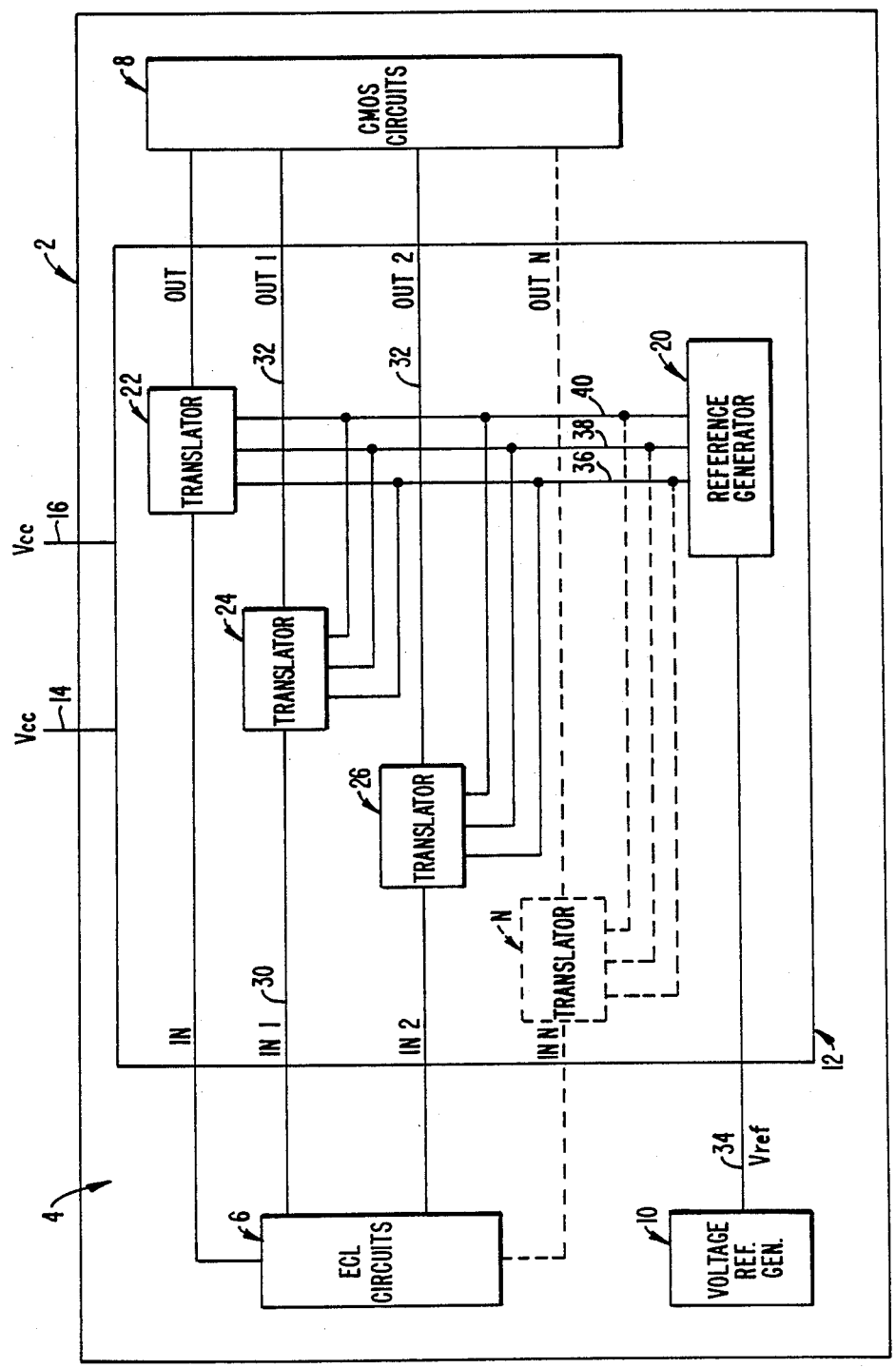
FIG._1.

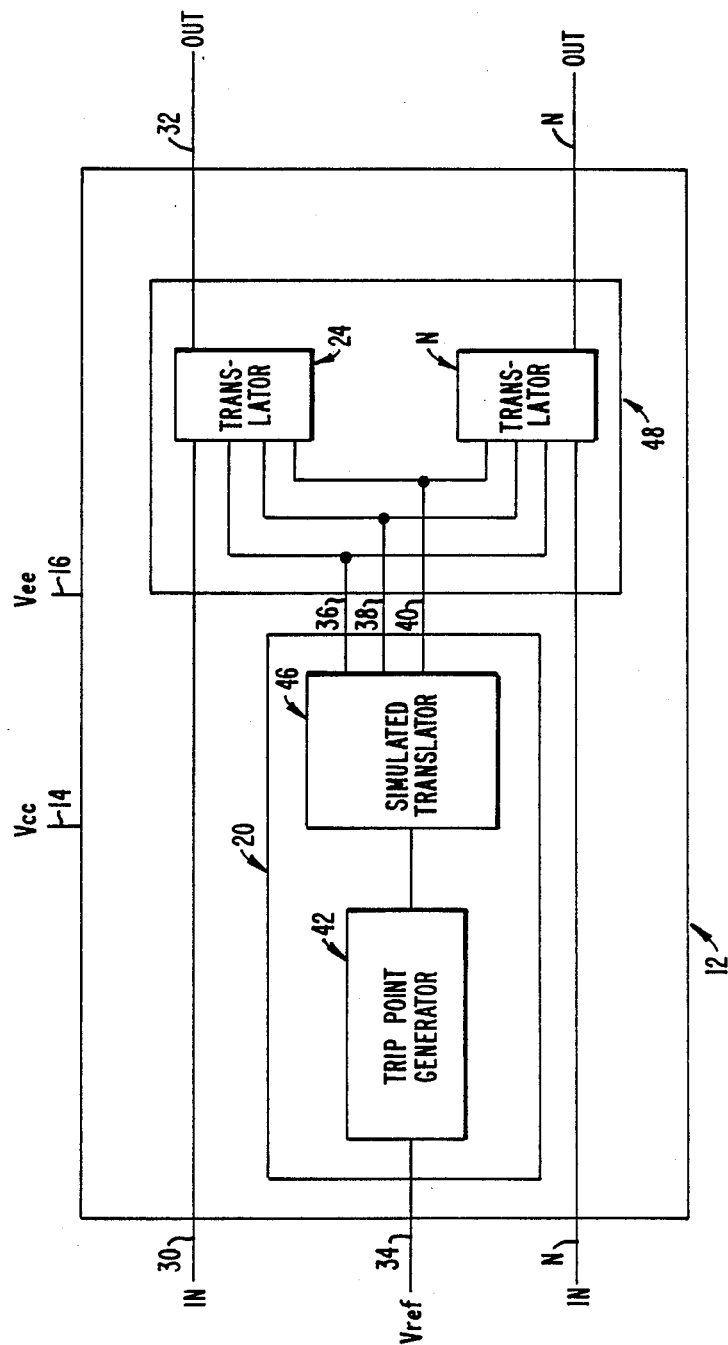
FIG._2.

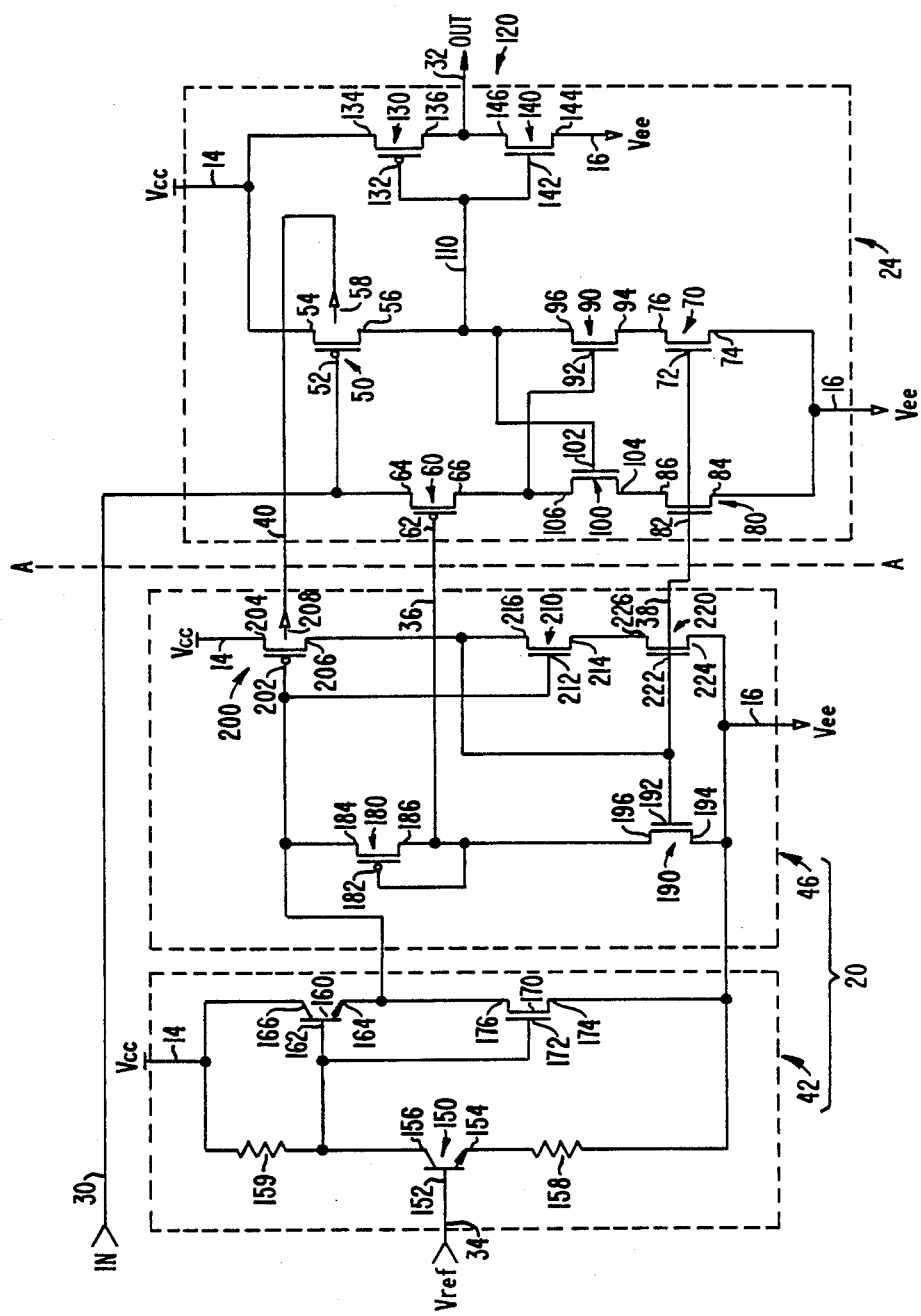
FIG._3.

LOW-POWER BIPOLAR-CMOS INTERFACE CIRCUIT

BACKGROUND OF THE INVENTION

1. Field of the Invention

This invention relates to electronic circuits, and in particular, to circuits for interconnecting and translating logic signals from bipolar emitter-coupled logic voltage levels to complementary metal oxide semiconductor voltage levels.

2. Description of the Prior Art

With the advent of advanced process technologies, integrated circuits now may be fabricated which employ both bipolar and field effect transistors. For such circuits to function satisfactorily, interface circuitry is required to translate between the voltage levels of the various devices employed on the integrated circuit. An important criterion for such interface circuitry is the voltage at which the interface circuits change state, known as the trip point voltage. In prior art circuits, the trip point voltage was specified by a trip point reference voltage provided to each translation circuit. Unfortunately, because of variations in process parameters and manufacturing tolerances, the individual transistors in each translator will have slightly different characteristics at different locations on the integrated circuit. Thus, the trip point defined by that translator will vary from that desired.

An additional disadvantage of prior art voltage translators for interfacing bipolar and field effect devices is the current consumed by each translator. Although each translator, by itself, draws only a small current, the large number of translators required for very large scale integrated circuits resulted in considerable current and therefore excessive power consumption.

SUMMARY OF THE INVENTION

This invention provides an interface circuit for translating a plurality of signals from bipolar transistor voltage levels to field effect transistor voltage levels. In the preferred embodiment the interface circuit includes a reference generator circuit which establishes control voltages for use by a plurality of identical translator circuits. The control voltages force the translator circuits to have specified trip points, which trip points are typically midway between emitter-coupled logic (ECL) level high and low signals. Each translator circuit further includes a flip-flop to assure that no DC current is drawn by the translator during steady state operation.

In addition to assuring that the trip point in each translator circuit is uniform across the chip, the control voltages provided govern a current source in each translator circuit. This current source, coupled in series with the flip-flop, assures predictable latching and unlatching of the flip-flop in each translator circuit thereby minimizing power consumption.

The present invention is particularly advantageous as it minimizes the effects of production variations in the characteristics of the transistors in the interface circuits. Such production variables include threshold voltage, transconductance, gate oxide thickness, and channel length. The control voltages employed enhance the production yield of the interface circuit and assure reliable performance over a wide range of operating conditions.

The reference generator circuit itself includes a trip point generator circuit and a simulated translator circuit. The trip point generator circuit receives an input reference voltage and in response generates a trip point voltage which is provided as an input signal to the simulated translator circuit.

In the simulated translator circuit, in response to the provided trip point voltage, specific bias levels are established. By forming the transistors in the simulated translator in a manner identical to the transistors in the actual translators, the bias levels established in the simulated translator will be very close to the bias levels at which the actual translators are to be biased, thereby forcing each translator to trip at the desired trip point. A particular application for the interface circuit of our invention is in conjunction with a biCMOS static random access memory, or other biCMOS circuits requiring logic level translation.

BRIEF DESCRIPTION OF THE DRAWINGS

FIG. 1 is a block diagram of a preferred embodiment of the present invention;

FIG. 2 is a block diagram of the interface circuit in further detail; and

FIG. 3 is a schematic of the interface circuit.

DETAILED DESCRIPTION OF THE PREFERRED EMBODIMENTS

FIG. 1 is a block diagram of a preferred embodiment of the invention illustrating a portion of a semiconductor die 2 upon which the interface circuitry is desired. For purposes of illustration, the semiconductor die includes a group of ECL circuits 6 and a group of CMOS circuits 8. For the embodiment depicted, output signals from the bipolar circuits are supplied as input signals IN ... IN N to the interface circuit 12 shown in block form between the CMOS circuits 8 and the ECL circuits 6. The interface circuit 12 adjusts the logic levels appropriately and supplies output signals OUT ... OUT N to the CMOS circuits. For ECL level input signals, having a high of $-0.8$ volts and a low of $-2.6$ volts, the CMOS level signals will have a high of Vcc and a low of Vee. Of course, the figure is only for illustration, and in practice there will be many such interface circuits coupled between desired circuitry on the die. In addition to the circuitry described, the die will typically include a voltage reference generator 10, as well as external connections to receive at least an upper power supply Vcc 14 and a lower power supply Vee on node 10.

As shown in FIG. 1, the interface circuit 12 includes a single reference generator 20 and a plurality of translator circuits 22, 24, 26, and N. Each translator circuit receives an ECL level input signal from the ECL circuits, and in response, supplies a CMOS level output signal to the CMOS circuits 8. For example, translator 24 is connected to receive input IN 1 on line 30 and supply output OUT 1 on line 32.

The reference generator 20 is connected to receive an input signal Vref on line 34 from the external source 10, and in response thereto, generate three control voltages which it applies to lines 36, 38, and 40. As shown by the figure, the control voltages on these lines are supplied to each translator circuit.

FIG. 2 is a block diagram of interface circuit 12 showing the reference generator 20 in further detail. Reference generator 20 includes a trip point generator 42 and a simulated translator 46. Also shown in FIG. 2 are a pair of actual translator circuits 24 and N. The reference generator 20 provides each of translators 24 and N with the three control voltages on lines 36, 38, and 40.

FIG. 3 is a detailed circuit schematic of the reference generator 20 coupled to a single translator circuit 24. The trip point generator circuit 42 is connected to receive an input signal Vref supplied on line 34. From this input signal, the combined trip point generator 42 and simulated translator 46 supply the control voltages on lines 36, 38, and 40. The translator circuit 24 receives an ECL level input signal on line 30, and with the control voltages, supplies a CMOS level output signal on line 32.

The first control voltage on line 40 is applied to the N-well 58 of PMOS transistor 50 to force the threshold characteristics of transistor 50 to match the base-emitter characteristics of a bipolar transistor. The control voltage on line 40 is obtained from a well bias generator such as described in Huffman, et al., "Substrate Bias Generator Optimizes Military MOS Memories," *Military Electronics/Countermeasures* (September 1977), p. 62, and forces transistor 50 to have Vthreshold = −0.8 volts. Without this "matching," transistor 50 would always be on if |Vthreshold| < |Vbe|, where Vthreshold is the threshold voltage for transistor 50, and Vbe is the base-emitter voltage of a bipolar transistor, approximately 0.8 volts. Were N-well 58 tied to upper power supply Vcc, as would normally be the case, Vthreshold for transistor 50 could vary considerably as a result of production variations.

A second control voltage on line 36 is applied to gate 62 of second PMOS transistor 60 in the translator. The second control voltage is approximately 0.8 volts below the "low" level of the ECL input on line 30. The second control voltage is therefore approximately (Vcc−2.4−0.8) volts, or (Vcc−3.4) volts. The second control voltage forces transistor 60 to have a trip point equal to the desired trip point, −1.6 volts in the preferred embodiment.

A third control voltage on line 38 is applied to gate 72 of current source transistor 70, and to gate 82 of current source transistor 80. The third control voltage is a function of the characteristics of the NMOS and PMOS transistors. The third control voltage becomes relatively more positive if the PMOS transistors increase in conductivity (due to lower threshold voltage, or shorter electrical channel length, higher transconductance, thinner gate oxide layer) and becomes more negative when the PMOS transistors decrease in conductivity, etc. The current source transistors 70 and 80 are identical and operate as mirrored current sources, supplying current proportional to the third control voltage.

The operation of translator circuit 24 is as follows. PMOS transistor 50, flip-flop transistor 90, current source transistor 70 are serially connected. Similarly, PMOS transistor 60, flip-flop transistor 100, and current source transistor 80 are also serially connected. As the following analysis will demonstrate, when PMOS transistor 50 is "on", second PMOS transistor 60 and flip-flop transistor 90 are "off". When PMOS transistor 60 is off, series flip-flop transistor 100 is "on". No DC current is drawn at steady state because one flip-flop transistor 90 or 100 will always be "off", blocking the flow of DC current.

Consider first the case where the ECL input signal on line 30 is "high", i.e., approximately (Vcc−0.8) volts. Transistor 50 is forced by the first control voltage to be off when the input signal on line 30 is more positive than (Vcc−0.8) volts. Therefore, when the ECL input on line 30 is high, PMOS transistor 50 is off and draws no current. At the same time, PMOS transistor 60 is on because when the ECL input signal on line 30 is "high", the voltage from gate 62 to source 64 is more negative than the threshold voltage of transistor 60. That is, source 64 is at potential (Vcc−0.8) volts, while the gate 62 is at (Vcc−2.4−Vthreshold) by the control voltage on line 36. As long as |Vthreshold| < 1.6 volts, transistor 60 will be on. Because Vthreshold is approximately −0.8 volts, this condition is readily met.

With transistor 60 on, the voltage at its drain 66 and source 64 are equal, namely the "high" level on line 30, (Vcc−0.8) volts. Drain 66 is connected to gate 92 of transistor 90, and as drain 66 rises toward (Vcc−0.8) volts, gate 92 of transistor 90 rises. As gate 92 rises, transistor 90 turns on because the voltage at gate 92 (Vcc−0.8) volts is at least a threshold voltage greater than the voltage at source 94. Although transistor 90 is on, the portion of circuit 24 consisting of transistors 50, 90, and 70 draws no DC current because transistor 50 is off. Similarly, transistors 60, 100 and 80 are connected in series. Although transistor 60 is on, transistor 100 is off and therefore no DC current is drawn through the series.

Transistors 90 and 100 are connected together as a latch flip-flop with gate 102 of transistor 100 connected to drain 96 of transistor 90, and gate 92 of transistor 90 connected to drain 106 of transistor 100. Transistor 100 is off because as transistor 90 turns on, its drain 96 approaches Vee. When gate 102 is pulled down to Vee by drain 96 of transistor 90, transistor 100 will have zero gate-source voltage and will be off.

Thus, when the ECL input signal on line 30 is "high", transistors 60 and 90 are on, and the voltage at drain 56 of first PMOS transistor 50 will be Vee. Drain 56 is connected at node 110 as an input to a conventional inverter 120 comprising PMOS transistor 130 and NMOS transistor 140. Transistors 130 and 140 have their respective gates 132, 142 tied together and their respective drains 136, 146 tied together. Source 134 is tied to upper supply Vcc and source 144 is tied to lower supply Vee. Since the magnitude of node 110 is Vee and transistor 140 is off, transistor 130 is on, and the inverter output on line 32 is Vcc. Therefore when translator circuit 24 receives an ECL "high" on input line 30, the translator output on line 32 is a CMOS "high" equal to Vcc. Translation has been accomplished with no steady state DC current being drawn by translator portion 22 of interface circuit 12.

Next, consider the response of translator 24 when the ECL input on line 30 is "low", i.e., (Vcc−2.4) volts. PMOS transistor 50 will have a gate-source voltage equal to −2.4 volts. Because this gate-source voltage exceeds the threshold voltage dictated by the first control voltage on line 40, PMOS transistor 50 will turn on. As transistor 50 turns on, its drain 56 rises toward upper supply Vcc, turning on flip-flop transistor 100 and turning off transistor 90. Simultaneously, the second control voltage on line 36 causes PMOS transistor 60 to turn off because its gate-source potential is less than Vthreshold. Therefore, when the ECL input on line 30 is "low", transistors 50 and 100 are on. Since transistor 50 is on, its drain 56 is at a potential equal to Vcc, and the input to inverter 120 at node 110 is at Vcc, and the inverter output on line 32 will be at Vee. Thus, translator circuit 24 has translated an ECL "low" input on line 30 to a CMOS "low" level output on line 32, while drawing no steady-state current.

Proper latching and unlatching of the flip-flop transistors 90 and 100 is assured by current source transistors 70 and 80. As an example, assume the ECL input on line 30 goes from "high" to "low". PMOS transistor 50 will begin to turn on; drain current will begin to flow; and the voltage at drain 56 will begin to rise. If drain 56 can rise sufficiently, second flip-flop transistor 100 will start to turn on. As transistor 100 starts to turn on, the voltage at drain 106 begins to drop. As long as transistor 50 can supply sufficient drain current to raise the potential at drain 56, transistor 50 will turn on, and proper latching will occur.

Proper control of the current flowing from PMOS transistor 50 or PMOS transistor 60 assures proper latching and unlatching of flip-flop transistors 90 and 100. To appreciate the role of current source transistors 70 and 80, first assume that current source transistor 70 is replaced by a resistor R, connected from source 94 to Vee. With resistor R present, an increase in potential at drain 56 would require an increase in drain current from PMOS transistor 50 because resistor R would demand more current from transistor 50 as its drain potential increased. If transistor 50 could not supply the additional drain current, then proper latching and unlatching of transistors 90 and 100 might not occur. On the other hand, use of a current source such as transistor 70 allows transistor 50 to supply the requisite drain current to raise the voltage at drain 56, thus reliably latching and unlatching flip-flop transistors 90 and 100.

The reference generator portion 20 of FIG. 3 generates the three control voltages. The voltage trip point is made to be the desired DC level at which the actual translators should trip. The trip point is set to within approximately 50 mV of the midpoint between an ECL level "high" and "low". The trip point voltage from generator 42 is provided as a DC input signal to the "simulated" translator 46, whereupon the transistors comprising simulated translator 46 assume certain bias voltages. The transistors in the simulated translator are identical to the transistors in the translator. Therefore, the bias voltages present in "simulated" translator 46 are identical to the bias voltages that would exist in an actual translator when presented with an ECL input level equal to the trip point voltage.

Various of the bias voltages established in the simulated translator 46 are used as control voltages and are applied to corresponding bias points in each of the plurality of translator circuits. Three bias points in the simulated translator are fed to similar bias points in the translators as first, second and third control voltages. In response to these control voltages, each translator is forced to have a trip point equal to that established by the trip point generator.

Trip point generator 42 receives an input reference voltage Vref on line 34. Reference voltage Vref on line 34 is a stable reference voltage, approximately 1.25 volts above Vee. Vref is supplied from the Reference Voltage Generator described in application Ser. No. 07/151,348 filed Feb. 2, 1988, entitled "BiCMOS Voltage Reference Generator," and commonly assigned.

Within reference generator 20, Vref is applied to base 152 of transistor 150 to establish a known current through emitter resistor 158 equal to (Vref−Vbe−−Vee)/(resistor 158), where Vbe is the base-emitter voltage drop of transistor 150. As a result, a known collector current flows through resistor 159, and the voltage drop across resistor 159 is made to be approximately 0.85 volts. Transistor 160 acts as an emitter follower and the voltage at its emitter 164 will be the voltage at its base 162 less a Vbe voltage drop. The voltage at emitter 164 is approximately two base-emitter voltage drops below upper power supply Vcc, i.e., the desired trip point. Transistor 170 acts as a load for emitter 164 and has its gate 172 tied to base 16 transistor 160, its drain 176 tied to emitter 164 and its source 174 tied to lower supply Vee.

The trip point voltage established by trip point voltage generator 42 is presented as an input signal to simulated translator 46. Simulated translator 46 includes PMOS transistors 180 and 200, current source transistors 190 and 220, and NMOS transistor 210. The desired trip point voltage at emitter 164 of transistor 160 is tied to gate 202 of PMOS transistor 200, while source 204 is tied to Vcc on line 14. PMOS transistor 200 is on because its gate 202 is approximately 1.5 volts more negative than source 204. The current from transistor 200 through transistor 220 is mirrored by current source transistor 190. NMOS transistor 210 has its gate 212 tied to gate 202 of transistor 200, and its drain 216 tied to drain 206 of transistor 200, and to gates 222 and 192 of current source transistors 220 and 190 respectively. Source 214 of transistor 210 is connected to drain 226 of first current source transistor 220.

With an input signal on gate 202 of PMOS transistor 200 equal to the desired trip point voltage of the actual translator circuits, the bias voltage established within simulated translator 46 correspond to the bias voltages present in an actual translator 22 whose ECL input signal is at a level equal to the trip point established by trip point generator 42.

The ECL-CMOS interface circuit 12 typically is fabricated on the same die as the biCMOS circuit for which it provides ECL to CMOS interface translation.

The invention has been described with reference to a preferred embodiment. It should be understood that modifications and variations can be made to the disclosed embodiment without departing from the scope of the invention as defined in the following claims. For example, other control voltages could be used to maintain the reliability of the translator circuit with regard to variations in transistor characteristics. The trip point generations could be accomplished with a different circuit from that shown, or the desired trip point may be a level other than approximately midpoint on the signal to be translated. Those skilled in the art will recognize that the translator trip point may be intentionally skewed by varying the characteristics of the transistors in the "simulated" translator.

We claim:

1. An interface circuit comprising:
   at least one translator circuit for translating a first level signal to a second level signal, the translator circuit comprising a first plurality of transistors and having a plurality of nodes, the translator circuit including means for preventing current flow in the translator circuit when the second level signal is at a steady state high and low level;
   generator means for generating a desired trip point voltage;
   a simulated translator circuit connected between the translator circuit and the generator means to receive the desired trip point voltage and simulate one of the translator circuits, the simulated translator circuit comprising a second plurality of transistors having a plurality of nodes, each of the second plurality of transistors being biased to a particular bias level in response to the trip point voltage;

connecting means for connecting at least one node in said simulated translator circuit to a corresponding node in the translator circuit to provide a control voltage bias signal to establish a desired trip point for the translator circuit.

2. A circuit as in claim 1 wherein the means for preventing includes a flip-flop in each said translator circuit.

3. A circuit as in claim 1 wherein each said translator circuit includes at least one transistor in series with a latch type flip-flop in series with a current source means.

4. An interface circuit as in claim 3 wherein said current source means are controlled by a control voltage bias signal from the simulated translator.

5. An interface circuit as in claim 3 wherein each said transistor in said translator circuit includes an input terminal and a plurality of output terminals, wherein at least one terminal on at least one said transistor is connected to receive a control voltage bias signal from the simulated translator circuit.

6. An interface circuit comprising:
at least one translator circuit for translating an ECL level signal to a CMOS level signal, the translator circuit comprising a first plurality of transistors and having a plurality of nodes, and further having a trip point established by at least one control voltage bias signal;
a trip point generator for providing a predetermined trip point voltage;
a simulated translator circuit including a second plurality of transistors connected to simulate the translator circuit and having a plurality of nodes, the simulated translator coupled to receive said trip point voltage as an input signal;
means for connecting at least one node in said simulated translator circuit to a corresponding node in each said translator circuit as a control voltage bias signal, establishing thereby identical trip points for the translator circuit and the simulated translator circuit; and
means connected to each translator circuit for preventing flow of DC current in the translator circuit at steady state;
whereby identical trip points are substantially equal to the predetermined trip point voltage.

7. The interface circuit of claim 6, wherein the means for preventing includes a latch type flip-flop in each said translator circuit.

8. The interface circuit of claim 7, wherein each said translator includes at least one transistor in series with a latch type flip-flop in series with a current source means.

9. The interface circuit of claim 8, wherein said current source means are controlled by a control voltage bias signal from the simulated translator.

10. The interface circuit of claim 8, wherein said transistor includes an input terminal and a plurality of output terminals, at least one of said terminals being connected to a said control voltage bias signal from said simulated translator.

11. An interface circuit comprising in combination:
at least one translator circuit for translating an ECL level signal to a CMOS level signal, each translator circuit comprising a first plurality of transistors and having a plurality of nodes, and further having a trip point established by at least one control voltage bias signal, each said translator including at least one transistor in series with a latch type flip-flop in series with a current source means, said current source means having an input terminal;
a trip point generator for providing a predetermined trip point voltage;
a simulated translator circuit comprising a second plurality of transistors connected to simulate one said translator circuit and having a plurality of nodes, each said transistor including an input terminal and a plurality of output terminals, said simulated translator coupled to receive said trip point voltage as an input;
means for connecting at least one node in said simulated translator circuit to a corresponding node in each said translator circuit as a control voltage bias signal, establishing thereby identical trip points for each said translator circuit, the nodes selected including said input terminal of said current source means and at least one said terminal on at least one said transistor comprising each said translator circuit;
means connected to each translator circuit for preventing the flow of DC current in each said translator circuit at steady state, the means for preventing includes a latch type flip-flop in each said translator circuit;
whereby the identical trip points are substantially equal to the predetermined trip point voltage.

* * * * *